(12) United States Patent
Chino (10) Patent No.: US 8,368,235 B2
(45) Date of Patent: Feb. 5, 2013

(54) RESIN SEALING METHOD OF SEMICONDUCTOR DEVICE

(75) Inventor: Teruaki Chino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 481 days.

(21) Appl. No.: 12/687,466

(22) Filed: Jan. 14, 2010

(65) Prior Publication Data

US 2010/0184256 A1    Jul. 22, 2010

(30) Foreign Application Priority Data

Jan. 16, 2009   (JP) ................................ 2009-008000

(51) Int. Cl.
*H01L 23/29* (2006.01)
*H01L 21/00* (2006.01)

(52) U.S. Cl. ........................................ 257/788; 438/125

(58) Field of Classification Search .......... 257/787–790, 257/730–733; 438/124–127
See application file for complete search history.

(56) References Cited

U.S. PATENT DOCUMENTS 7,157,311 B2 * 1/2007 Meguro et al. ................. 438/110
8,211,754 B2 * 7/2012 Yamano ......................... 438/124

FOREIGN PATENT DOCUMENTS

JP          4-283987      10/1992
JP          2004-128286   4/2004

* cited by examiner

*Primary Examiner* — Calvin Lee
(74) *Attorney, Agent, or Firm* — Rankin, Hill & Clark LLP (57) ABSTRACT

A resin sealing method of a semiconductor device includes: positioning semiconductor devices at predetermined positions of an adhesive layer formed on a support body and adhering the semiconductor devices thereto, sealing a part of each of the semiconductor devices with resin by curing a first seal resin in a fluidization state so as to fix the semiconductor devices adhered to the predetermined positions of the adhesive layer formed on the support body, setting the semiconductor devices fixed to the predetermined positions of the adhesive layer formed on the support body in a mold and sealing the exposure parts of the semiconductor devices exposed from the first seal resin with a second seal resin, and removing the support body and the adhesive layer from the semiconductor devices sealed with the resin.

9 Claims, 11 Drawing Sheets

PLAN VIEW

FIG. 2B

SECTIONAL VIEW

FIG. 3A

PLAN VIEW

FIG. 3B

SECTIONAL VIEW

PLAN VIEW

FIG. 6B

SECTIONAL VIEW

FIG. 7A

PLAN VIEW

FIG. 7B

SECTIONAL VIEW

PLAN VIEW

FIG. 9B

SECTIONAL VIEW

RESIN SEALING METHOD OF SEMICONDUCTOR DEVICE

CROSS-REFERENCE TO RELATED APPLICATION

This application is based on and claims priority under 35 U.S.C. §119 from Japanese Patent Application No. 2009-008000 filed on Jan. 16, 2009.

BACKGROUND OF THE INVENTION

1. Technical Field

This invention relates to a resin sealing method of a semiconductor device and more particularly to a resin sealing method of a semiconductor device for making it possible to prevent misregistration of the semiconductor device at the resin sealing time when the semiconductor device disposed at a predetermined position of a support plate is sealed with a resin.

2. Related Arts

After each of semiconductor devices each formed with electrode terminals on one side is positioned and is disposed with the electrode terminals aimed at an adhesive layer applied onto a support body, an opposite side of each of the semiconductor devices is sealed with a seal resin in a collective manner. This method is known as a molding method. Representative molding methods are, for example, a transfer molding method of injecting a seal resin from a side face of semiconductor devices positioned and disposed on a support body and sealing the semiconductor devices with the resin and a compression molding method of compressing a seal resin supplied from the upper face of semiconductor devices positioned and disposed on a support body and the semiconductor devices in an up and down direction and sealing the semiconductor devices with the resin.

As a specific example of the molding method, for example, a method described in Patent Document 1 is available.

In the molding method described in Patent Document 1, an epoxy-based adhesive layer is applied onto a support plate made of a metal substrate and the face of a semiconductor device where electrode terminals are formed is adhered to a predetermined position of the uncured adhesive layer and then the semiconductor device is sealed with an insulating resin and next the support plate is peeled off from the insulating resin and then the adhesive layer is removed and the electrode terminals are exposed and then a re-wiring circuit and external connection bumps are connected.

[Patent document 1] Japanese Patent Laid-Open No. 283987/1992 (see paragraphs [0033] to [0040] and FIG. 7)

In the molding method in Patent Document 1, since the support plate and the adhesive layer are peeled off from the semiconductor device sealed with resin, the adhesive layer and the semiconductor device are lightly adhered to each other so as to easily peel off the semiconductor device and the adhesive layer. On the other hand, in recent years, a support substrate has been formed large and the number of semiconductor devices mounted on the support plate has increased. Thus, it has become evident that there is a problem in that when the semiconductor devices are sealed with resin, misregistration of some semiconductor devices occurs because of a seal resin flow. Such misregistration of the semiconductor devices makes it impossible to form micro wiring after resin seal and results in defectives of most or all of the semiconductor devices on the support plate and reduction in yield.

SUMMARY OF THE INVENTION

It is therefore an object of the invention to solve problems of a conventional resin sealing method of a semiconductor device wherein misregistration of semiconductor devices is caused easily to occur by the fluid power of a seal resin when the semiconductor devices adhered to predetermined positions of an adhesive layer formed on one face side of a support plate are sealed with resin and provide a resin sealing method of a semiconductor device wherein misregistration of semiconductor devices caused by the fluid power of a seal resin is hard to occur when the semiconductor devices adhered to predetermined positions of an adhesive layer formed on one face side of a support plate are sealed with resin.

To solve the problems, the inventor considered that when semiconductor devices are fixed onto an adhesive layer on a support plate, it is effective to adopt additional fixing means in addition to the adhesive force of the adhesive layer, and has reached the invention.

That is, according to a first aspect of the invention, there is provided a resin sealing method of a semiconductor device including:

positioning semiconductor devices at predetermined positions of an adhesive layer formed on a support body and adhering the semiconductor devices thereto, sealing a part of each of the semiconductor devices with resin by curing a first seal resin in a fluidization state so as to fix the semiconductor devices adhered to the predetermined positions of the adhesive layer formed on the support body, setting the semiconductor devices fixed to the predetermined positions of the adhesive layer formed on the support body in a mold and sealing the exposure parts of the semiconductor devices exposed from the first seal resin with a second seal resin, and removing the support body and the adhesive layer from the semiconductor devices sealed with the resin.

According to a second aspect of the invention, there is provided the resin sealing method of a semiconductor device in the first aspect, wherein a liquid resin is used as the first seal resin, and is cured to seal a part of each of the semiconductor devices with the resin.

Accordingly, the semiconductor devices can be fixed at the initial positions with the first seal resin without misregistration of the semiconductor devices adhered to the adhesive layer.

According to a third aspect of the invention, there is provided the resin sealing method of a semiconductor device in the first or second aspect, wherein a frame body surrounding the outer periphery of the resin seal area is disposed to prevent the first seal resin in the fluidization state from flowing out to the outside of the resin seal area when a part of each of the semiconductor devices is sealed with the first seal resin.

Accordingly, the first seal resin in the fluidization state con be left in the seal area on the support body, so that contamination of the resin sealing device of the semiconductor devices caused by outflow of the first seal resin from the seal area on the support body can be prevented.

According to a fourth aspect of the invention, there is provided the resin sealing method of a semiconductor device in any one of the first to third aspects, wherein the exposure parts each having a height of a half or less of the height dimension of each of the semiconductor devices are sealed with the first seal resin.

Accordingly, position fixing of the semiconductor devices with the first seal resin and sealing the exposure parts of the semiconductor devices with the second seal resin can be accomplished reliably.

According to a fifth aspect of the invention, there is provided the resin sealing method of a semiconductor device in any one of the first to fourth aspects, wherein after the cured surface of the first seal resin is roughened, the whole exposure parts of the semiconductor devices exposed from the resin seal portion with the first seal resin are sealed with the second seal resin.

Accordingly, the adhesive force on the boundary between the resin seal portions with the first seal resin and the second seal resin is enhanced and peeling off of the resin seal portion with the first seal resin and the resin seal portion with the second seal resin on the boundary can be prevented.

According to a sixth aspect of the invention, there is provided the resin sealing method of a semiconductor device in any one of the first to fifth aspects, wherein the semiconductor devices are sealed with the first seal resin and the second seal resin different in heat contraction coefficient.

Accordingly, it is made possible to preferably prevent warpage and deformation of the resin seal portions of the semiconductor package and the semiconductor unit using the semiconductor package and a product excellent in appearance can be provided.

Further, according to a seventh aspect of the invention, there is provided a resin sealing method of a semiconductor device including:

positioning semiconductor devices at predetermined positions of an adhesive layer formed on a support body and adhering the semiconductor devices thereto, forming stoppers for positioning the semiconductor device along the outer periphery of the semiconductor device adhered to the predetermined position of the adhesive layer formed on the support body, setting the semiconductor devices positioned at the predetermined positions of the adhesive layer formed on the support body in a mold and sealing the whole exposure parts of the semiconductor devices with a seal resin, and removing the support body and the adhesive layer from the semiconductor devices sealed with the resin.

According to an eighth aspect of the invention, there is provided the resin sealing method of a semiconductor device in the seventh aspect, wherein stopper recesses where the surface of the support body is exposed on the bottom face are formed at the predetermined positions of the adhesive layer formed on the support body, then, the semiconductor devices are adhered to the predetermined positions of the adhesive layer determined based on the stopper recesses, and next the stoppers are provided in the stopper recesses.

Accordingly, the positions where the semiconductor devices are disposed on the adhesive layer formed on the support body can be shown clearly, so that positioning of the semiconductor devices onto the adhesive layer can be accomplished easily and precisely.

According to a ninth aspect of the invention, there is provided the resin sealing method of a semiconductor device in the seventh aspect, wherein a stopper is provided at a predetermined position of the adhesive layer formed on the support body, and the semiconductor device is adhered to the predetermined position of the adhesive layer determined based on the stopper.

Accordingly, when the stopper is provided upright on the adhesive layer, no semiconductor device is adhered, so that it is not feared that the position of the semiconductor device positioned to the adhesive layer may be erroneously shifted when the stopper is provided upright.

According to a tenth aspect of the invention, there is provided the resin sealing method of a semiconductor device in any one of the seventh to ninth aspects, wherein the stopper is formed of a wire material and is formed using a wire bonding device.

Accordingly, the stopper can be provided upright with good accuracy in a short time using a conventionally used device without new capital investment.

The invention makes it possible to fix the positioning state of the semiconductor devices and the adhesive layer formed on the support body reliably with the first seal resin or the stoppers. Thus, if the seal resin is pressed (or transferred) at a high pressure, the positioning state of the semiconductor devices and the adhesive layer can be reliably maintained. Accordingly, it is made possible to form a re-wiring circuit appropriately for all of the semiconductor devices after sealed with resin, yield improves, and it is made possible to manufacture semiconductor products efficiently.

In the first aspect of the invention, when the semiconductor devices are positioned and fixed onto the adhesive layer on the support plate, the first seal resin as a part of the resin seal portion is used, so that it can be made unnecessary to remove the fixing means of the positioning state of the semiconductor devices after the semiconductor devices are sealed with the resin.

Particularly, in the second aspect of the invention, the fixing means of the positioning state of the semiconductor devices can be used as guides for positioning and adhering the semiconductor devices onto the adhesive layer; this point is particularly advantageous.

DETAILED DESCRIPTION OF THE PREFERRED EMBODIMENTS (First Embodiment)

A resin sealing method of a semiconductor device according to a first embodiment of the invention will be discussed. FIGS. 1A to 3B are plan views and sectional views taken on line A-A to show the state in each step when semiconductor devices are sealed with resin according to the first embodiment of the invention. FIGS. 4A to 4D are sectional views taken on line A-A in FIG. 3A when the semiconductor devices are sealed with second seal resin. FIGS. 5A to 5F are sectional views to show the state of each step after FIG. 4D. The cross-sectional positions in FIG. 5A to 5F are the same as those in FIG. 4A to 4D.

Figure 1A:
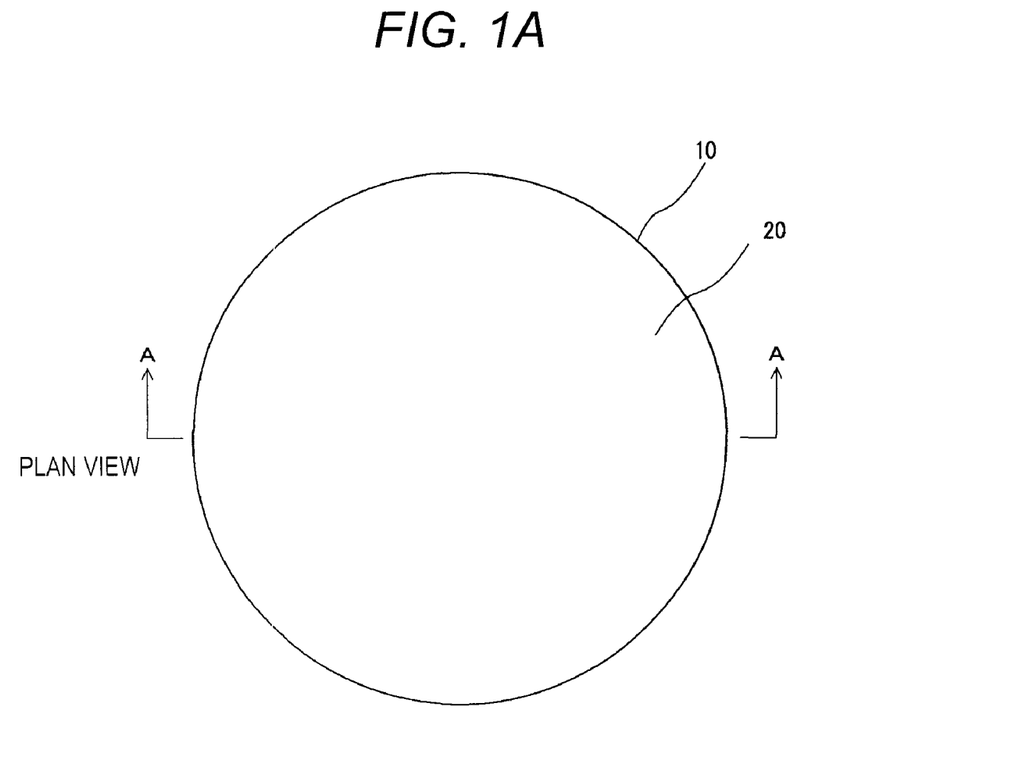
FIGS. 1A and 1B area plan view and a sectional view taken on line A-A to show the state in each step when semiconductor devices are sealed with resin according to a first embodiment of the invention.
Figure 1B:
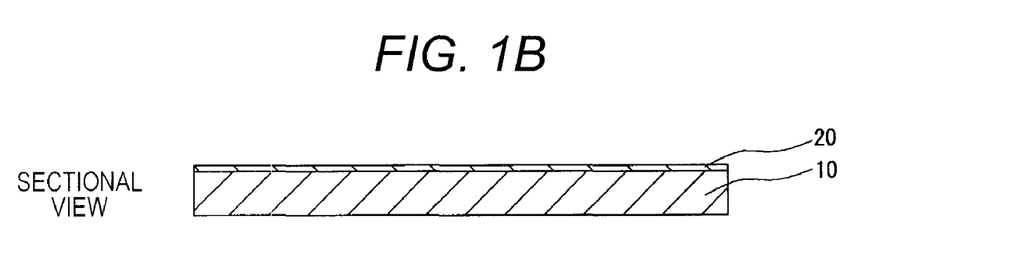

To begin with, as shown in FIGS. 1A and 1B, an adhesive layer 20 to adhere each semiconductor device 30 to a support body 10 made of a thin copper plate is formed. An epoxy-based adhesive is applied or an adhesive sheet is put on the upper face of the support body 10, whereby the adhesive layer 20 can be formed. In the embodiment, the plate thickness of the support body 10 is 200 μm and the thickness of the adhesive layer 20 is 30 μm.

Figure 2A:
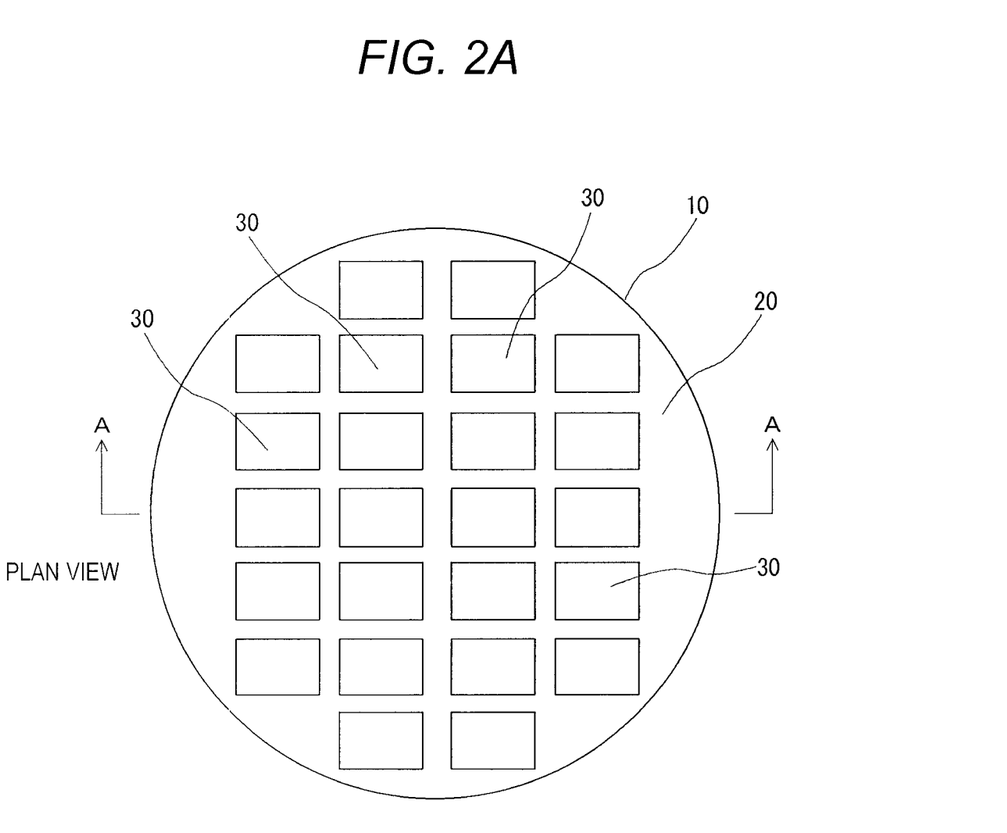
FIGS. 2A and 2B are a plan view and a sectional view taken on line A-A to show the state in each step when the semiconductor devices are sealed with resin according to the first embodiment of the invention.
Figure 2B:
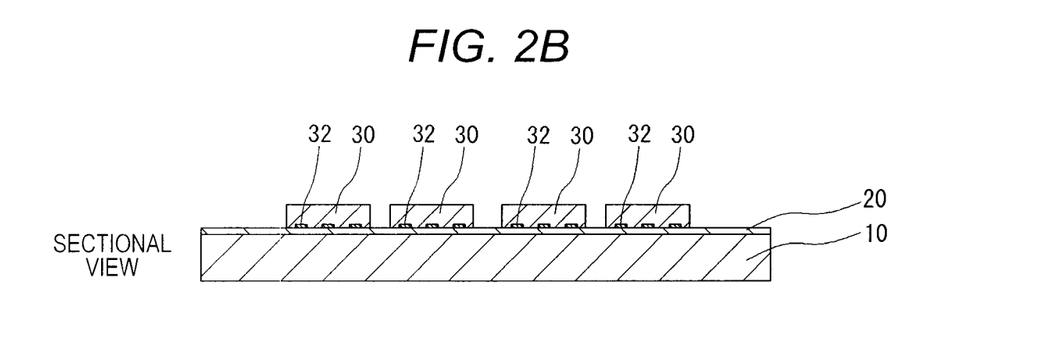

Next, as shown in FIGS. 2A and 2B, the semiconductor devices 30 are adhered to the upper face of the adhesive layer 20. The semiconductor devices 30 are held in a state in which they are arranged in a jig (not shown) and the face of each semiconductor device 30 where electrode terminals 32 are formed (the lower face of the semiconductor device 30 in the sectional view of FIG. 2B) is positioned on the adhesive layer 20 and is adhered thereonto. To position the semiconductor devices 30, a method of controlling the conveying operation of the jig based on the periphery position of the support body 10 and a method of setting a reference position of a coordinate axis on the support body 10, etc., and performing coordinate management from the reference point can be adopted. The figure shows a mode in which the electrode terminals 32 of the semiconductor devices 30 are formed flush with the outer surfaces of the semiconductor devices 30; however, the electrode terminals 32 may project from the outer surfaces of the semiconductor devices 30.

Figure 3A:
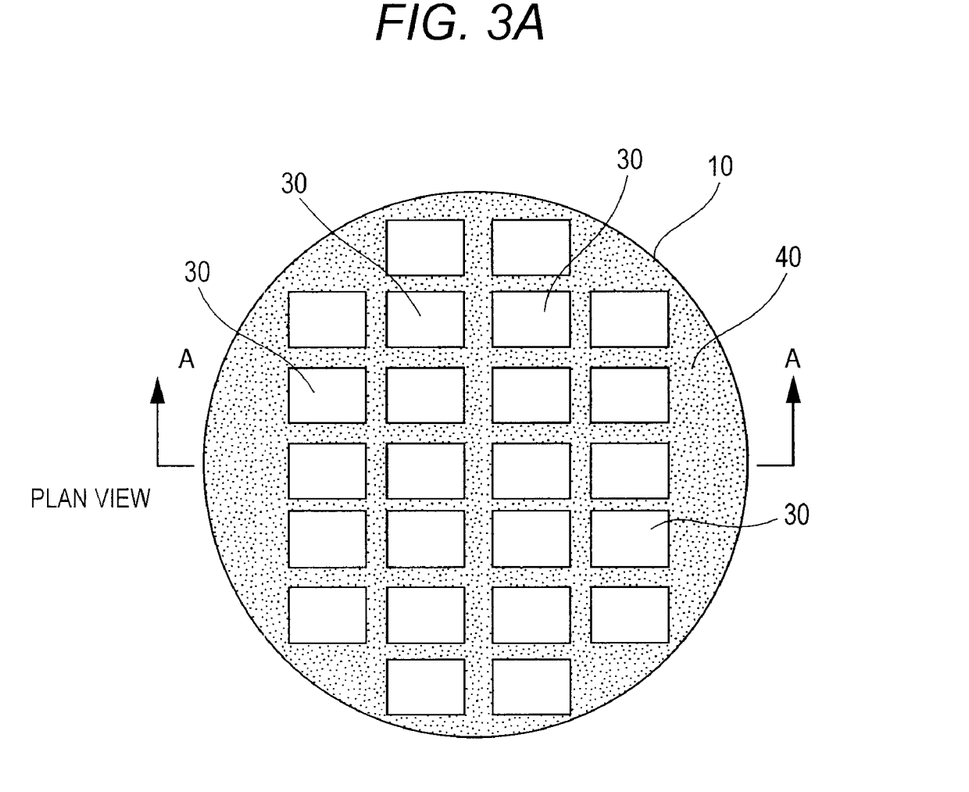
FIGS. 3A and 3B are a plan view and a sectional view taken on line A-A to show the state in each step when the semiconductor devices are sealed with resin according to the first embodiment of the invention.
Figure 3B:
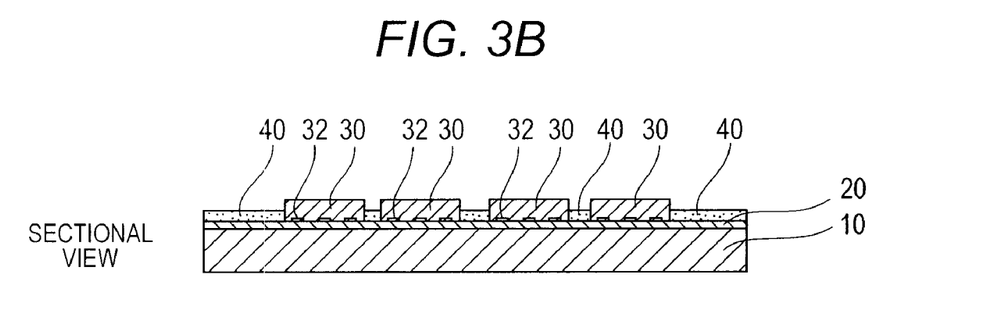

When the semiconductor devices 30 are thus adhered in a state in which they are positioned on the upper face of the adhesive layer 20, seal resin supply means (not shown) supplies a liquid resin 40 of a first seal resin to a surface exposure portion of the adhesive layer 20. Here, a resin used as an underfill of flip chip connection made of a heat curing epoxy resin is used as the liquid resin. It is advantageous that the seal resin supply means has a configuration wherein a dispenser, etc., capable of supplying the liquid resin 40 along the surface exposure area of the adhesive layer 20 so as to prevent the liquid resin 40 from splashing on the upper faces of the semiconductor devices 30 is held by conveying means. The supply operation of the seal resin supply means is controlled previously so as to supply the liquid resin 40 a small amount at a time so that misregistration of the semiconductor devices 30 adhered to the adhesive layer 20 does not occur. The liquid resin 40 is supplied to the height position as much as a half of the height dimension of the semiconductor device 30 as shown in FIGS. 3A and 3B. The liquid resin 40 thus supplied is heated by heating means (not shown) and is cured and becomes a first seal resin 42, and the semiconductor devices 30 adhered to the adhesive layer 20 are sealed with the resin to a half of each semiconductor device in the height direction thereof and the positioning state is fixed (maintained).

Figure 4A:
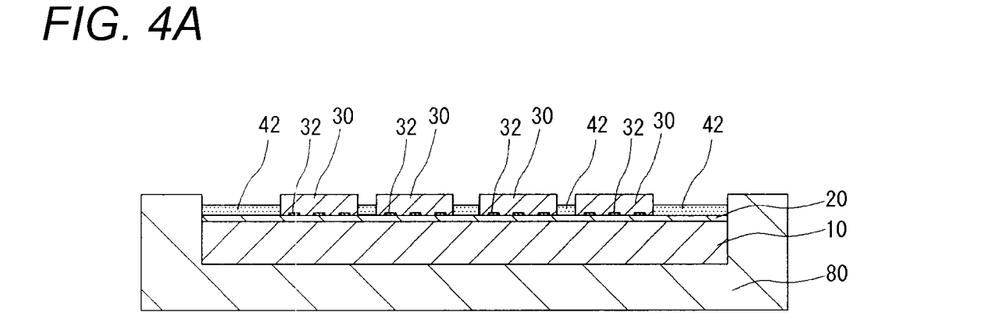
FIGS. 4A to 4D are sectional views taken on line A-A in FIG. 3A when the semiconductor devices are sealed with second seal resin.
Figure 4B:
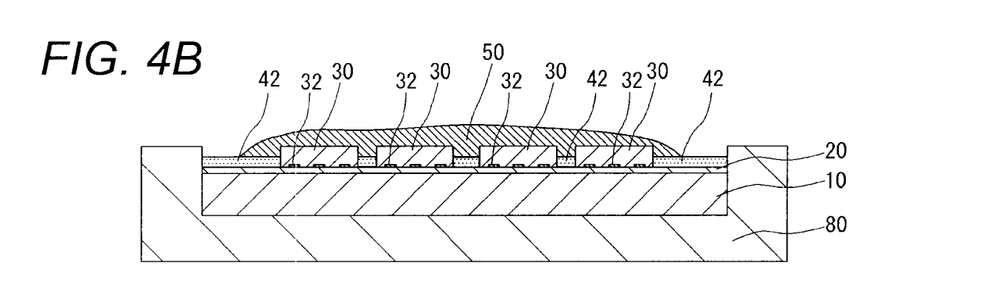
Figure 4C:
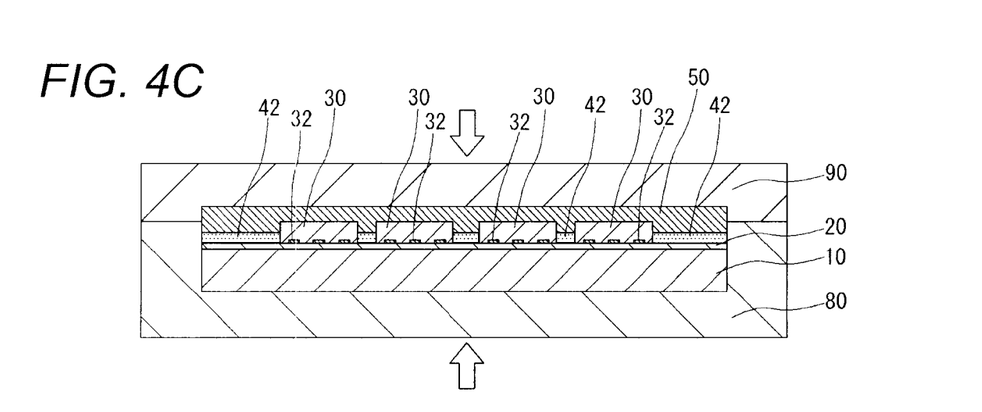
Figure 4D:
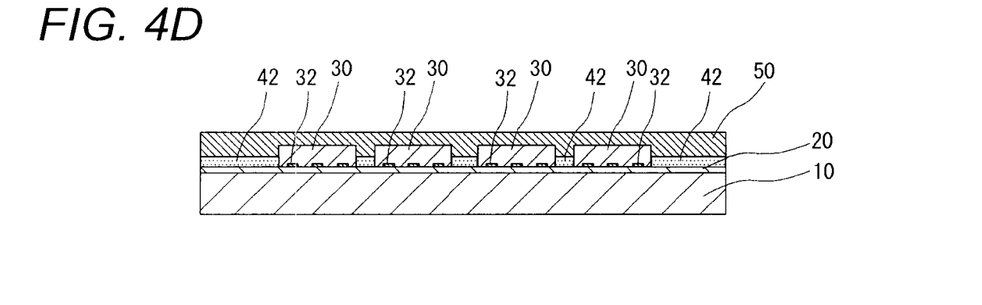

Next, the semiconductor devices 30 positioned and fixed onto the adhesive layer 20 (the upper face of the support body 10) with the first seal resin 42 are sealed with a mold resin 50 of a second seal resin. First, as shown in FIG. 4A, the support body 10 and the positioned and fixed semiconductor devices 30 are set in a female mold 80. To enhance the adhesive properties of the first seal resin 42 and the mold resin 50 of the second seal resin, after the liquid resin 40 is heated and cured to form the first seal resin 42, the surface of the first seal resin 42 may be roughened by plasma treatment, etc. The seal resin supply means supplies a predetermined amount of the meld resin 50 onto the first seal resin 42 after roughened, as shown in FIG. 4B. As the mold resin 50, a known material formed like liquid, granules, a tablet, etc., can be used. Here, liquid mold resin 50 is used. Next, mold clamping is performed with a metal mold (compression metal mold) made up of an upper die 90 and the above-mentioned female mold 80, as shown in FIG. 4C. At this time, the mold resin 50 is heated and cured by heating means (not shown) contained in at least either the upper die 90 or the female mold 80 to seal the whole semiconductor devices 30 with the resin. After completion of thus sealing the portion exposed from the resin seal portion of the semiconductor devices 30 with the first seal resin 42 with the second seal resin (mold resin 50) using the metal mold (not only compression metal mold, but also transfer metal mold), the support body 10 and the semiconductor devices 30 sealed with the resin (molded with the resin) are taken out from the female mold 80. FIG. 4D shows the state of a resin molded article with the whole semiconductor devices 30 sealed with the resin as described above. FIGS. 4A to 4D show the resin seal state in which the semiconductor devices 30 are completely buried in the mold resin 50, but a resin seal mode in which the rear of each of the semiconductor devices 30 is exposed from the mold resin may be adopted. It is advantageous that such a resin seal mode can improve radiation of the semiconductor devices 30.

Figure 5A:
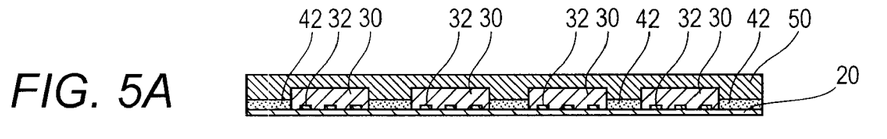
FIGS. 5A to 5F are sectional views to show the state of each step after FIG. 4D.
Figure 5B:
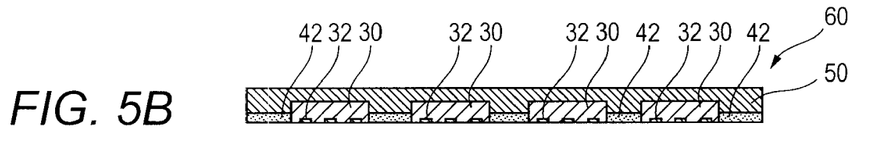

Next, the support body 10 is removed from the resin molded article as shown in FIG. 5A. To remove the support body 10, a wet etching method using a copper etching liquid or a method of mechanically peeling off the support body 10 can be adopted. Next, the adhesive layer 20 is removed to provide a seal body 60 as shown in FIG. 5B. To remove the adhesive layer 20, a known method such as laser light irradiation or etching can be applied. Thereby, the surface of the semiconductor devices 30, on which the electrode terminals 32 are provided, is exposed from the first seal resin 42.

Figure 5C:
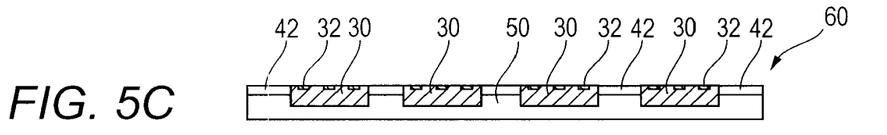
Figure 5D:
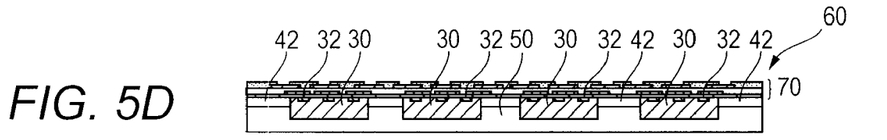
Figure 5E:
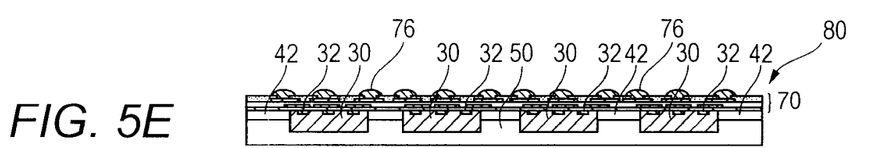

Subsequently, the seal body 60 shown in FIG. 5B is turned upside down as shown in FIG. 5C and then an insulating layer and wiring layer 70 is formed by a known method of a semi-additive method, an additive method, etc., with the electrode terminals 32 formed on the semiconductor devices 30 as the start point as shown in FIG. 5D. The insulating layer and wiring layer 70 is stacked on the first seal resin 42 and the surface of the semiconductor devices 30, on which the electrode terminals 32 are formed. The insulating layer and wiring layer 70 in the embodiment is made up of insulating layers 72a, 72b, and 72c and wiring layers 74a, 74b, 74c, and 74d. Next, as shown in FIG. 5E, external connection bumps 76 of solder bumps, etc., are joined to a wiring exposure portion on the top face of the insulating layer and wiring layer 70 to form an intermediate body 80. This intermediate body 80 is separated into discrete pieces for each of the semiconductor devices 30 to form a semiconductor package 90 as shown in FIG. 5F.

Figure 5F:
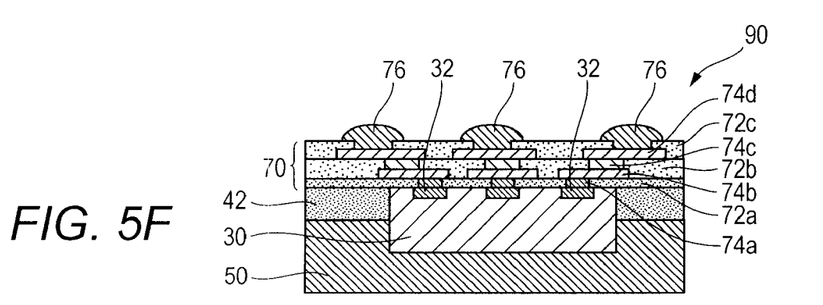

In the insulating layer and wiring layer 70 shown in FIGS. 5D to 5F, each hatched portion is a wiring layer (containing a via) and each portion filled with pale black is an insulating layer.

According to the resin mold method of the semiconductor device according to the embodiment, the side wall faces of the semiconductor devices 30 and the exposure face portion of the adhesive layer 20 are sealed with the first seal resin 42 to the predetermined height position, whereby the adhesion state with the adhesive layer 20 registered initially can be fixed. Accordingly, when the semiconductor devices 30 are later sealed completely with the mold resin 50 of the second seal resin, misregistration of the semiconductor devices 30 caused by a resin flow of the mold resin 50 in a fluidization state using a compression metal mold or a transfer metal mold does not occur. Therefore, the semiconductor devices 30 can be sealed with the resin with the initial design position maintained.

Since the semiconductor devices 30 can be thus sealed with the resin at the initial design position, when the electrode terminals 32 of the semiconductor devices 30 are formed with the insulating layer and wiring layer (re-wiring layer) 70 by a lithography method, etc., misregistration of the electrode terminals 32 of the semiconductor devices 30 does not occur. Accordingly, yield of the seal body 60 provided by sealing the semiconductor devices 30 with the resin and the intermediate body 80 and the semiconductor packages 90 provided using the seal body 60 improves and efficient production is made possible.

Since the semiconductor devices 30 are sealed with the liquid resin 40 and the mold resin 50 different in physical value of heat contraction coefficient, etc., warpage and deformation of the seal body 60, the intermediate body 80, and the semiconductor package 90 can be lightened according to combination of the physical values, the thicknesses, etc., of the resins and thus it is also advantageous that the appearances of the seal body 60, the intermediate body 80, and the semiconductor package 90 are excellent. The first seal resin 42 (liquid resin 40) of fixing means of the positioning state of the semiconductor devices 30 forms a part of the resin seal portion of each of the semiconductor devices 30, so that it is advantageous that removal of the fixing means of the positioning state of the semiconductor devices 30 becomes unnecessary.

(Second Embodiment)

A second embodiment of the invention is characterized by disposition of a frame body 12 to prevent a liquid resin 40 which becomes a first seal resin 42 for sealing a part of each semiconductor device 30 to fix the semiconductor device 30 from flowing out from the seal area on a support body. FIGS. 6A, 6B, 7A and 7B are plan views and sectional views taken on line A-A to describe sealing the semiconductor devices with resin according to the second embodiment of the invention. FIGS. 8A to 8F are sectional views to show the state in each step after FIG. 7B. The cross-sectional positions in FIGS. 8A to 8F are the same as those in FIGS. 6A, 6B, 7A and 7B.

Figure 6A:
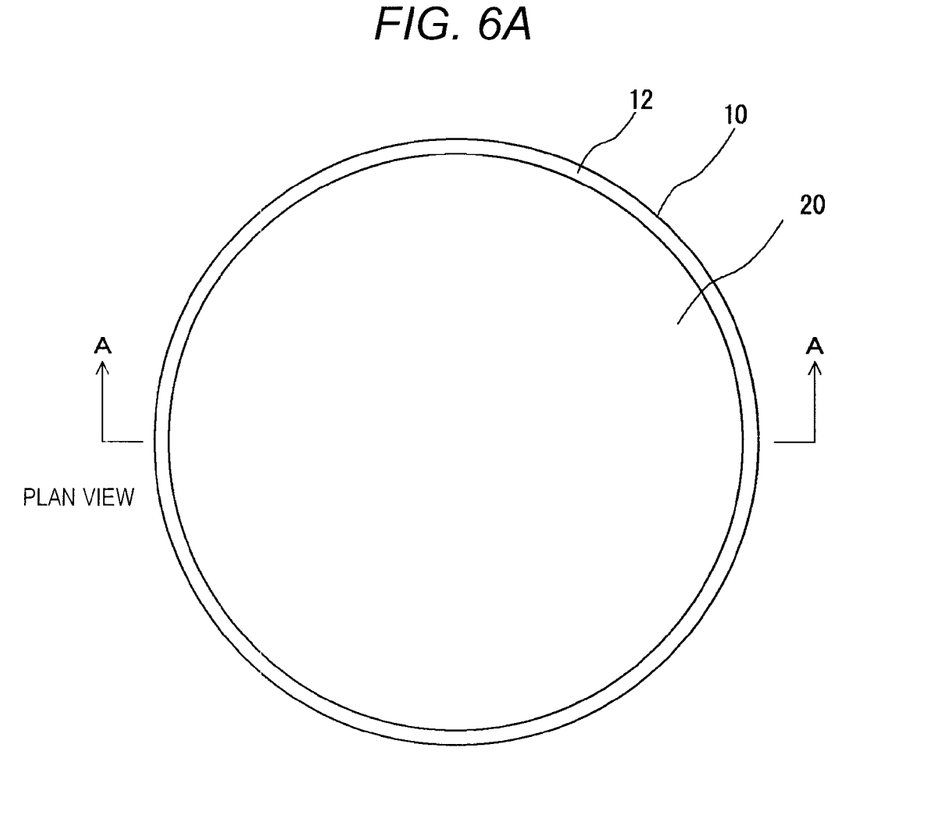
FIGS. 6A and 6B are a plan view and a sectional view taken on line A-A to describe sealing semiconductor devices with resin in a second embodiment of the invention.
Figure 6B:
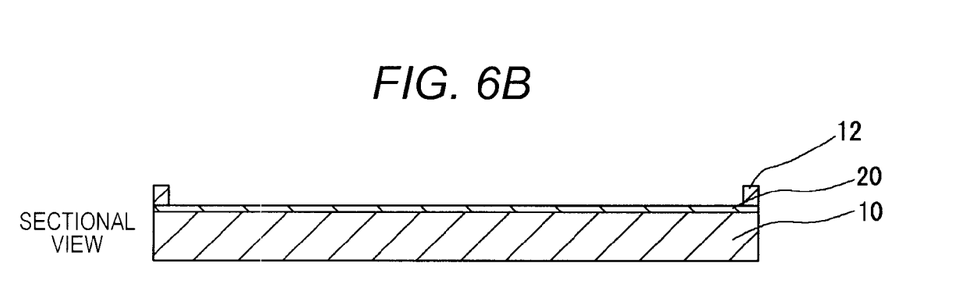

In the second embodiment, first, an adhesive layer 20 is formed on the upper face of a support body 10 as with the first embodiment. Then, the above-mentioned frame body 12 is disposed as shown in FIGS. 6A and 6B before the semiconductor devices 30 are adhered to the adhesive layer 20. The frame body 12 is made of a metal material of copper, etc., or a resin material and has a function as a dam part for simply preventing the liquid resin 40 of the first seal resin 42 (first seal resin in a fluidization state) from flowing out from the support body 10. Therefore, the material of the frame body 12 is not limited if it has a good adhesive property with the adhesive layer 20. The height dimension of the frame body 12 is not limited if it is a height dimension for preventing the liquid resin 40 of the first seal resin 42 from flowing out to the outside of the seat area and not becoming hindrance in a cavity when the semiconductor devices 30 are sealed with resin. In the embodiment, the height dimension of the disposed frame body is set to the same as the height dimension of the semiconductor device 30.

Figure 7A:
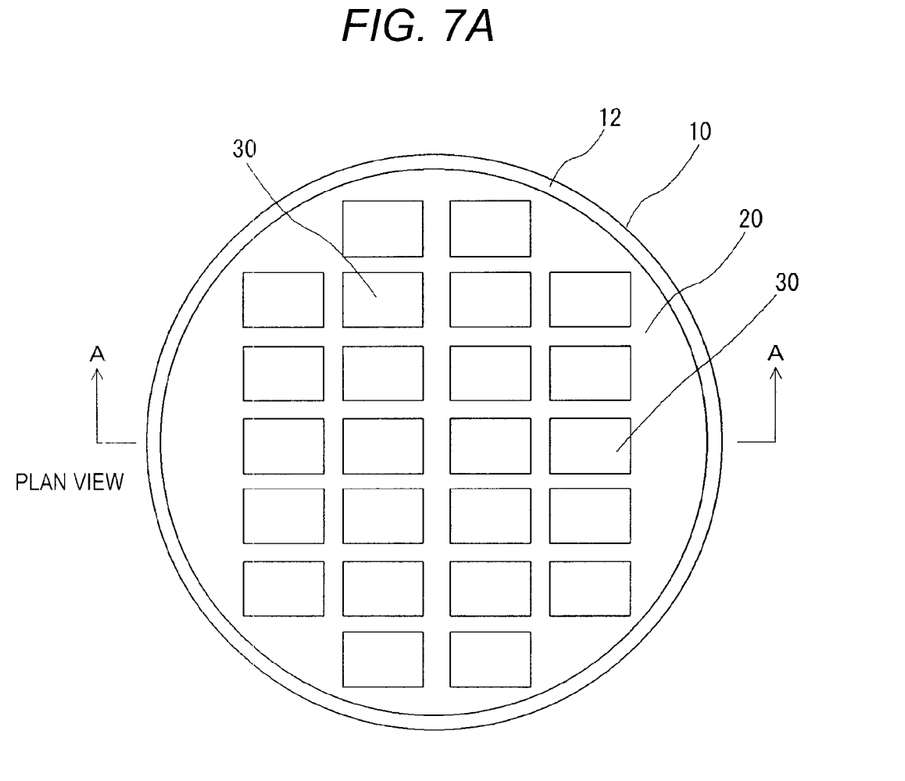
FIGS. 7A and 7B are a plan view and a sectional view taken online A-A to describe the sealing semiconductor devices with resin in the second embodiment of the invention.
Figure 7B:
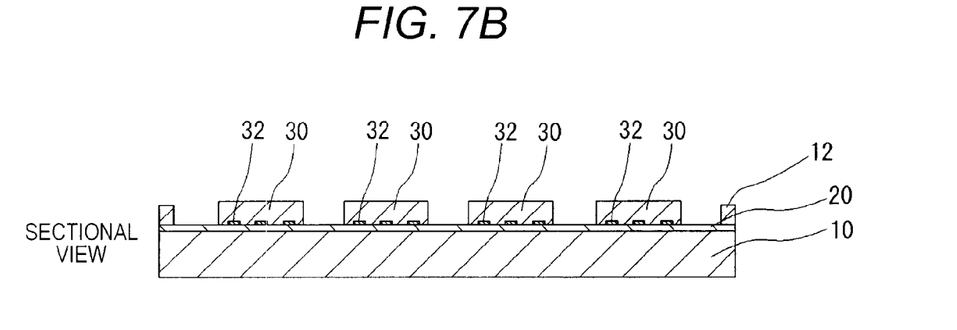
Figure 8A:
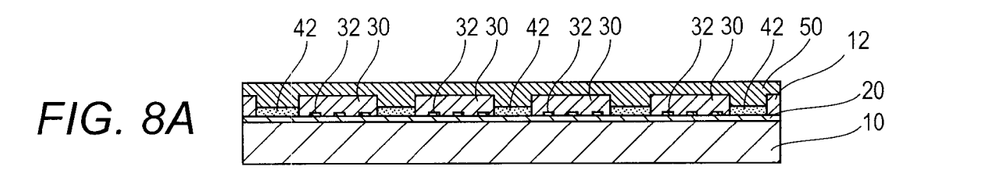
FIGS. 8A to 8F are sectional views to show the state in each step after FIG. 7B.
Figure 8B:
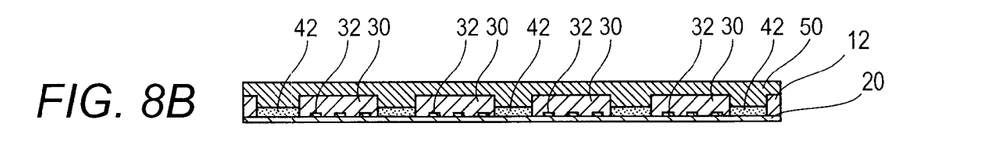
Figure 8C:
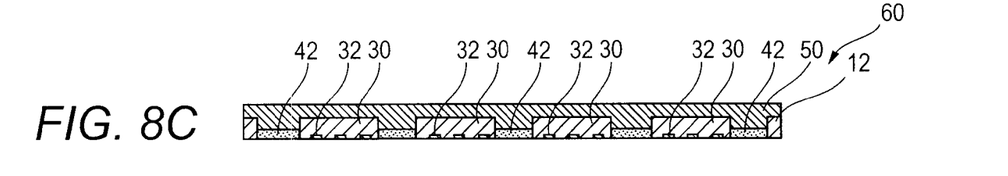
Figure 8D:
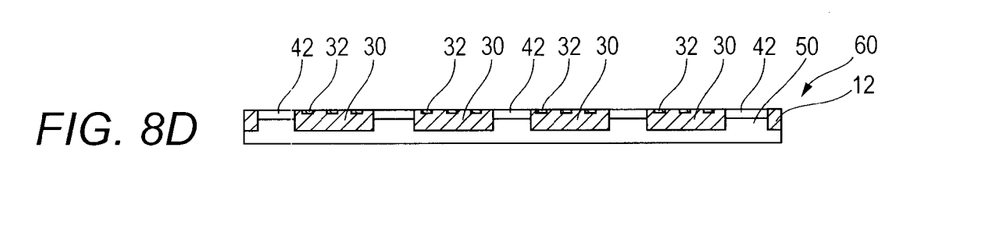
Figure 8E:
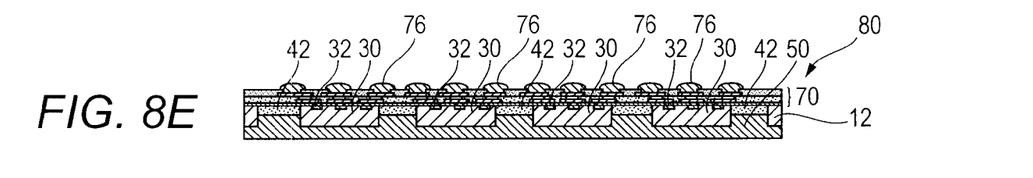
Figure 8F:
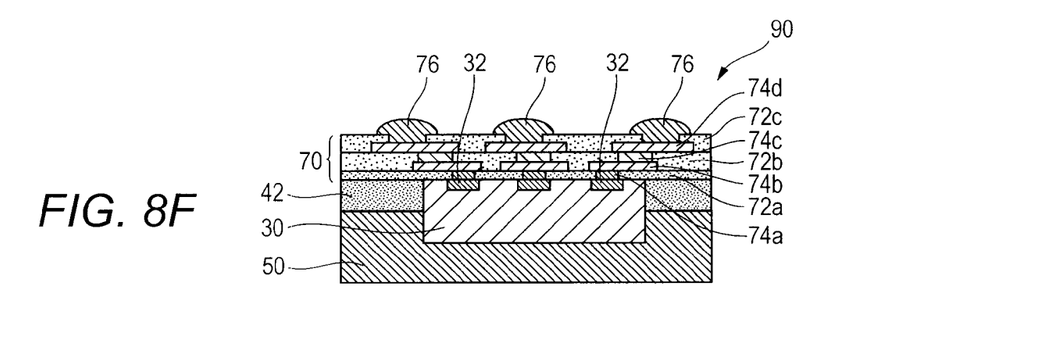

After the frame body 12 is adhered to the adhesive layer 20, the semiconductor devices 30 are adhered to the adhesive layer 20 in a predetermined arrangement state in a planar area (in the seal area) surrounded by the frame body 12, as shown in FIGS. 7A and 7B. Thus, in the embodiment, after the frame body 12 is adhered to the adhesive layer 20, the semiconductor devices 30 are adhered to the adhesive layer 20, but the adhering order of the frame body 12 and the semiconductor devices 30 to the adhesive layer 20 may be exchanged. After the frame body 12 and the semiconductor devices 30 are thus adhered to the adhesive layer 20, steps similar to the manufacturing steps (sealing the semiconductor devices 30 with the mold resin 50 of the second seal resin) previously described with reference to FIGS. 3A, 3B and 4A to 4C in the first embodiment are applied, whereby a resin molded article with the whole exposure portion of the semiconductor devices 30 sealed with the mold resin 50 on the support body 10 shown in FIG. 8A can be provided. After this, a similar procedure to that of the first embodiment is applied, whereby the support body 10 is removed (FIG. 8B), the adhesive layer 20 is removed to form a seal body 60 (FIG. 8C), the seal body 60 is turned upside down (FIG. 8D), an insulating layer and wiring layer 70 is formed by a known wiring pattern forming method of a semiadditive method, an additive method, etc., with electrode terminals 32 of the semiconductor devices 30 as the start point, and external connection bumps 76 of solder bumps, etc., are connected to a wiring layer exposed on the top face to form an intermediate body 80 (FIG. 8E). The configuration of the insulating layer and wiring layer 70 is the same as that of the first embodiment. Last, the intermediate body 80 is separated into discrete pieces for each of the semiconductor devices 30 with a dicing machine, etc., to provide a semiconductor package 90 (FIG. 8F). When the intermediate body 80 is separated into discrete pieces, the frame body 12 can be removed at the same time; however, when the adhesive layer 20 is removed, the frame body 12 may be removed.

In the embodiment, in addition to the characteristics of the first embodiment, the liquid resin 40 supplied to the exposure portion of the adhesive layer 20 (between the side wall faces of the adjacent semiconductor devices 30) to fix the positioning state of the semiconductor devices 30 adhered to the adhesive layer 20 can be prevented from flowing out from the upper face of the support body 10, so that it is advantageous that control of the supply amount when the liquid resin 40 is supplied can be simplified and that contamination of the device caused by outflow of the liquid resin 40 to the outside of the seal area can be prevented.

(Third Embodiment)

Figure 9A:
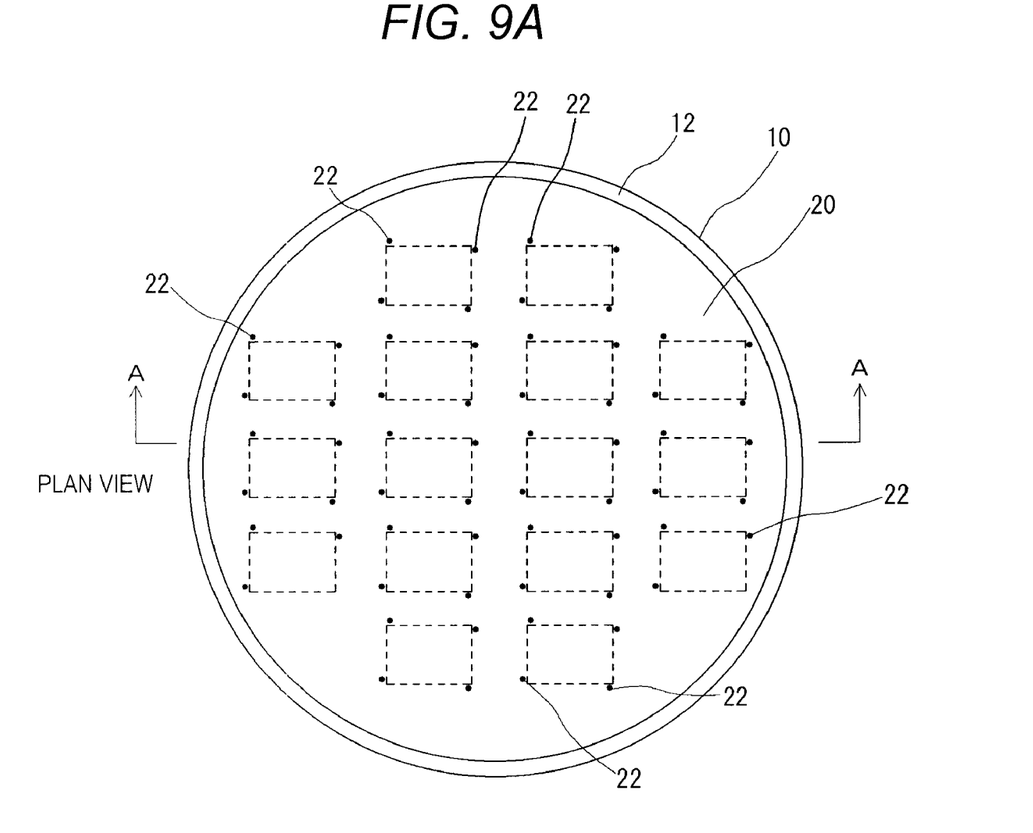
FIGS. 9A and 9B are views to show a state when a resin sealing method of a semiconductor device is executed in a third embodiment of the invention.
Figure 9B:
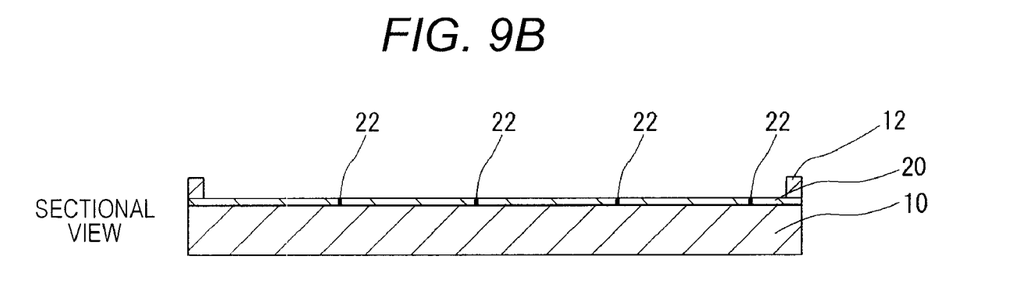

FIG. 9A is a plan view to show a state when a resin sealing method of a semiconductor device is executed in a third embodiment of the invention. FIGS. 10A to 10F are sectional views taken on line A-A to show the state when the resin sealing method of the semiconductor device is executed in the third embodiment of the invention.

The third embodiment is characterized by the fact that stoppers 24 are formed at positions along the periphery of semiconductor devices 30 as misregistration prevention means (fixing means) of the semiconductor devices 30 adhered to an adhesive layer 20 formed on the upper face of a support body 10.

First, the adhesive layer 20 is formed on the upper face of the support body 10 and a frame body 12 and the semiconductor devices 30 are positioned and are adhered to the adhesive layer 20 as in the second embodiment. After the semiconductor devices 30 are adhered to the adhesive layer 20, laser light irradiation means (not shown) forms stopper recesses 22 on the surface of the adhesive layer 20 along the periphery of semiconductor devices 30. Here, the stopper recesses 22 are formed at corners in the planar area of each semiconductor device indicated by the dashed line in FIG. 9A. The stopper recesses 22 are formed so as to pierce the adhesive layer 20 and expose the surface of the support body 10. To dispose the stopper recesses 22, each is formed at one outer position of the outer periphery of each of the semiconductor devices (indicated by the dashed line) formed like a rectangle on a plan view as shown in FIG. 9A; however, a plurality of stopper recesses 22 may be formed at one outer position of the outer periphery. The stopper recess 22 may be disposed at the outer position in an intermediate portion of the outer periphery, of course.

Figure 10A:
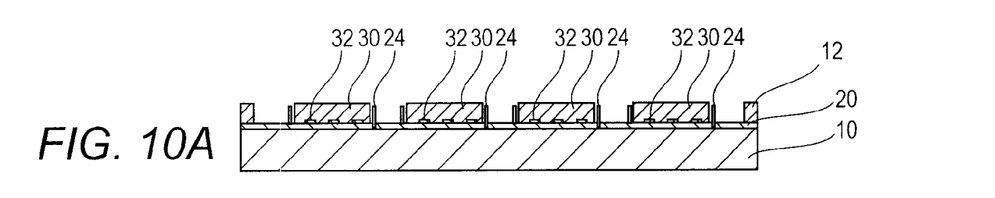
FIGS. 10A to 10F are sectional views taken on line A-A to show the state when the resin sealing method of the semiconductor device is executed in the third embodiment of the invention.

Next, each stopper 24 is provided upright at the position where the stopper recess 22 is formed, as shown in FIG. 10A. The stopper 24 can be formed by providing upright a gold bonding wire of a large diameter using a wire bonding device, for example. The stopper 24 may be formed having a height dimension to such an extent that a mold cavity is not hindered when the semiconductor device is sealed with resin and having dimensions having a strength resisting damage caused by a resin flow when the semiconductor device is sealed with resin. Here, the diameter dimension of the bonding wire of the stopper 24 is set to φ25 μm so that the stopper is formed slightly lower than the height dimension of the semiconductor device 30. The wire bonding device is thus used to form the stopper, whereby extremely accurate operation is made possible, so that they are fixed so that misregistration of the semiconductor devices 30 positioned at and adhered to the adhesive layer 20 does not occur; it is advantageous.

Figure 10B:
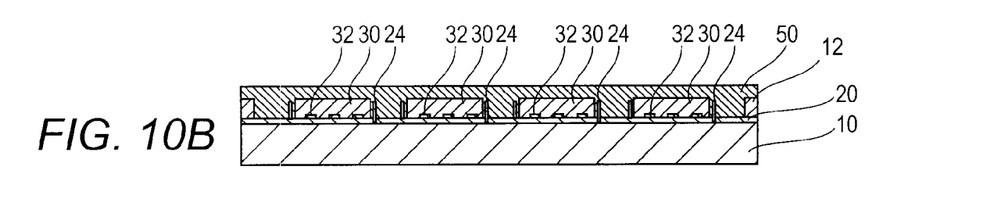
Figure 10C:
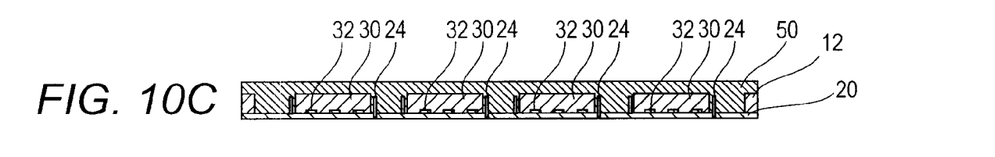
Figure 10D:
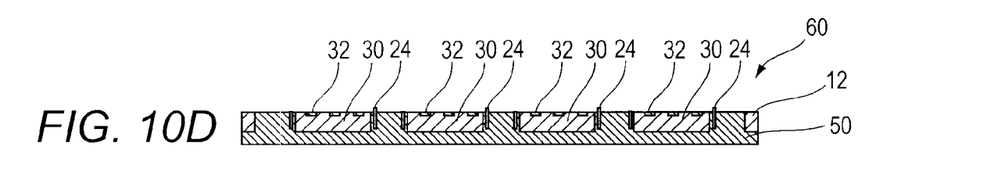
Figure 10E:
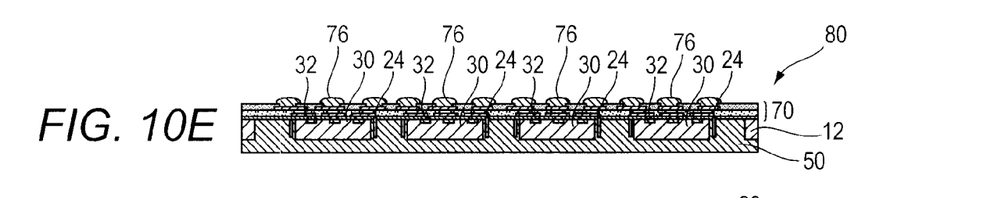
Figure 10F:
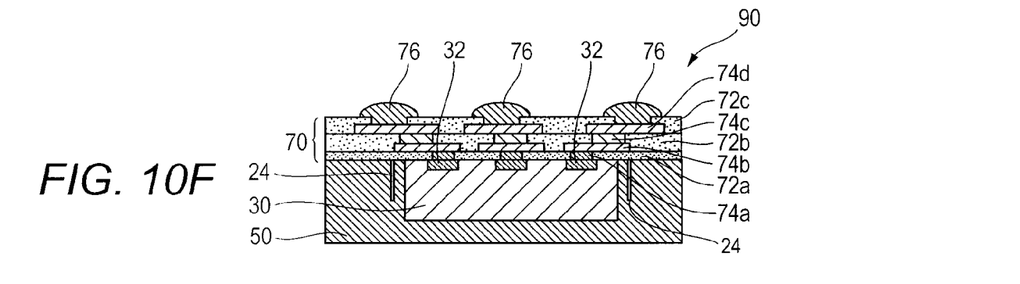

Next, the semiconductor devices 30 are sealed with a mold resin 50 as shown in FIG. 10B using a resin metal mold (compression metal mold made up of a female mold 80 and an upper die 90) in a similar manner to that previously described with reference to FIGS. 4A to 4C of the first embodiment. At the compression molding time, the mold resin 50 in a fluidization state flows from the center of the support body 10 toward the outer periphery of the support body 10; however, the semiconductor device 30 is held by the stoppers 24 and thus can maintain the initial adhesion position against the fluid power of the mold resin 50. Therefore, also in the embodiment, resin sealing treatment of the semiconductor devices 30 is made possible as designed. After this, the support body 10 is removed (FIG. 10C), the adhesive layer 20 is removed to form a seal body 60 and then the seal body 60 is turned upside down (FIG. 10D), an insulating layer and wiring layer 70 is formed by a known method of a semiadditive method, an additive method, etc., with electrode terminals 32 of the semiconductor devices 30 as the start point. The configuration of the insulating layer and wiring layer 70 is similar to that of the previous embodiment. As described above, each of the stopper recesses 22 pierces the adhesive layer 20 and thus the stopper 24 provided upright in the stopper recess 22 projects from the electrode terminal 32 face of the semiconductor devices 30. To solve this problem, the projection side end part of the stopper 24 may be cut or the thickness of a first insulating layer 72a in the insulating layer and wiring layer 70 may be formed more than the projection height of the stopper 24 (see FIG. 10F). External connection bumps 76 of solder bumps, etc., are connected to an opening of a wiring pattern on the top layer of the insulating layer and wiring layer 70 to provide an intermediate body 80 (FIG. 10E). Last, the intermediate body is separated into discrete pieces for each of the semiconductor devices 30 to provide a semiconductor package 90 (FIG. 10F).

In the embodiment, the stoppers 24 are provided upright at the proximity position of the outer periphery of the semiconductor device 30, whereby when the semiconductor devices 30 are sealed with resin, misregistration of the semiconductor devices 30 caused by a resin flow of the mold resin 50 in the resin mold can be prevented. Therefore, the semiconductor devices 30 can be sealed with the resin at the design position as with the previous embodiment. Thus, when a (re-)wiring circuit is formed for the electrode terminals 32 of the semiconductor devices 30 in a collective manner by a lithography method, etc., misregistration of the electrode terminals 32 of the semiconductor devices 30 does not occur. Accordingly, sealing the semiconductor devices 30 with the resin and yield of the seal body 60, the intermediate body 80, and the semiconductor packages 90 improve and efficient production is made possible.

While the invention has been described in detail based on the embodiment, it is to be understood that the invention is not limited to the embodiments, of course. For example, in the first and second embodiments, the mode in which the liquid resin 40 of underfill resin, etc., is adopted as the first seal resin is described, but granular resin can also be used in place of the liquid resin 40 as the supply mode of the first seal resin. In this case, if a resin material different from the second seal resin in physical value of heat contraction coefficient, etc., is used, warpage and deformation after cured can be lightened and thus it is advantageous.

If warpage or deformation of the seal body 60, the intermediate body 80, and the semiconductor package 90 does not introduce any problem, the physical values of the first seal resin and the second seal resin may be the same.

In the third embodiment, the mode in which the stopper recesses 22 formed in the adhesive layer 20 are formed using the laser light irradiation device is illustrated, but the stopper recesses 22 can also be formed by a photolithography method if the adhesive layer 20 is photosensitive. To form the stopper recesses 22 using the laser light irradiation device, each stopper recess 22 may be formed in a depth dimension such that it can be distinguished from any other part of the adhesive layer 20. The depth dimension of the stopper recess 22 can be easily controlled by adjusting output of applied laser light.

The mode in which each stopper 24 is formed by performing wire bonding of a gold bonding wire using the wire bonding device is illustrated, but the bonding wire is not limited to a gold bonding wire and may be made of any other material of copper, etc., if it can resist a motion of the semiconductor device 30, of course. If the surface of the support body 10 is exposed from the bottom face of the stopper recess 22 and both the support body 10 and the stoppers 24 are made of copper, the stoppers 24 can also be removed when the support body 10 is removed after the semiconductor devices 30 are sealed with resin. More preferably, an insulting paste is filled into the portions where the stoppers 24 are removed.

Further, the stoppers 24 are previously formed each like a columnar body of predetermined dimensions and are disposed on a jig, which is then positioned at the stopper recesses 22 and the stoppers 24 are pressed against the stopper recesses 22, whereby the stoppers 24 can also be provided upright at the outer periphery positions of the semiconductor device 30.

In the third embodiment, the stopper recesses 22 and the stoppers 24 are disposed after the semiconductor devices 30 are adhered to the adhesive layer 20; however, the stopper recesses 22 can also be formed or the stopper recesses 22 and the stoppers 24 can also be disposed before the semiconductor devices 30 are adhered to the adhesive layer 20. This is advantageous in that the formation positions of the stopper recesses 22 or the stoppers 24 can be used as guides when the semiconductor devices 30 are adhered to the adhesive layer 20. Erroneous moving of the positioned semiconductor devices 30 is prevented; this point is advantageous.

Further, the mode in which the stopper recesses 22 are formed in the adhesive layer 20 before the stoppers 24 are provided upright is described, but a mode in which the stoppers 24 are provided upright directly on the adhesive layer 20 without forming the stopper recesses 22 in the adhesive layer 20 may be adopted. Accordingly, the forming step of the stopper recesses 22 can be skipped and more efficient resin sealing of the semiconductor devices 30 can be accomplished.

Figure 11A:
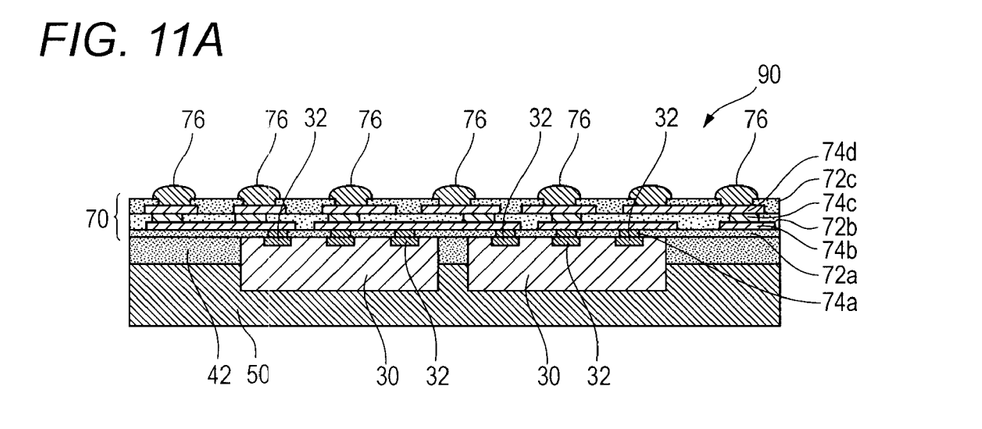
FIGS. 11A and 11B are schematic sectional views to show modified embodiments of semiconductor packages provided by the first to third embodiments of the invention.
Figure 11B:
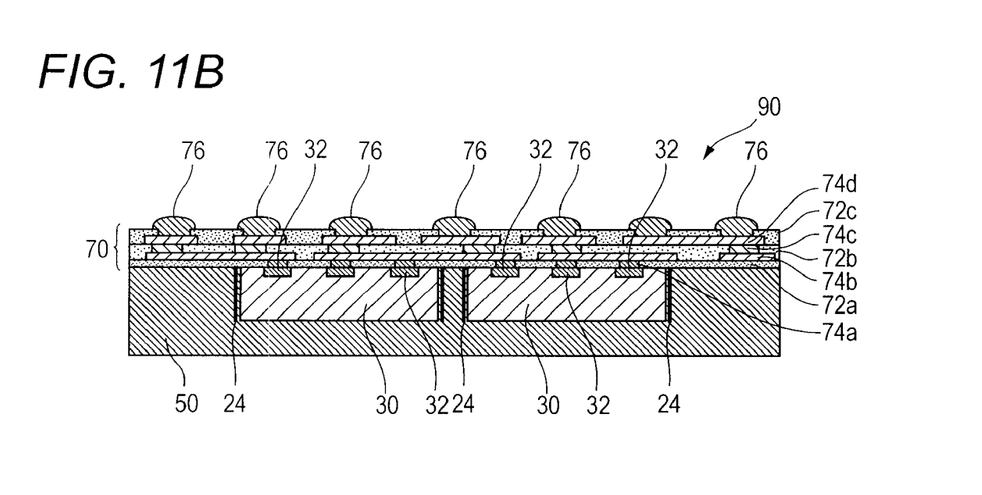

The invention is characterized largely by the fact that the semiconductor devices 30 can be sealed with resin in a state in which misregistration of the planar positions of the semiconductor devices 30 is prevented. Therefore, wiring (re-wiring) of electrically connecting the semiconductor devices 30 in the semiconductor packages 90 can be formed at a high density. In the embodiments described above, one semiconductor device 30 corresponds to one semiconductor package 90, but two or more semiconductor devices 30 can also be made to correspond to one semiconductor package 90 as shown in FIGS. 11A and 11B. FIG. 11A is a schematic sectional view to show a modified example of the first and second embodiments of the invention, and FIG. 11B is a schematic sectional view to show a modified example of the third embodiment of the invention.

In addition, although not specifically illustrated, an embodiment provided by using the embodiments described above in appropriate combination also belongs to the technical scope of the invention, needless to say.

Toe invention is useful particularly when semiconductor devices are sealed with resin using a compression mold or a transfer mold.

What is claimed is:

1. A semiconductor package, comprising:
   a multilayer wiring structure comprising a plurality of wiring layers and a plurality of insulating layers, the multilayer wiring structure comprising a first surface and a second surface opposite to the first surface;
   an external connection terminal on the first surface of the multilayer wiring structure;
   a semiconductor device on the second surface of the multilayer wiring structure, the semiconductor device comprising an electrode thereon, wherein the electrode is electrically connected to the multilayer wiring structure;
   a plurality of stoppers surrounding the semiconductor device so as to face side surfaces of the semiconductor device, each of the stoppers made of a bonding wire; and
   a sealing resin sealing the semiconductor device and the stoppers.

2. The semiconductor package of claim 1, wherein each of the stoppers is provided to face a corresponding corner of the semiconductor device.

3. The semiconductor package of claim 1, wherein the semiconductor device comprises four side surfaces, the number of stoppers is four, and each of the stoppers is provided to face a corresponding one of the side surfaces.

4. The semiconductor package comprising:
   a multilayer wiring structure comprising a plurality of wiring layers and a plurality of insulating layers, the multilayer wiring structure comprising a first surface and a second surface opposite to the first surface;
   an external connection terminal on the first surface of the multilayer wiring structure;
   a semiconductor device on the second surface of the multilayer wiring structure, the semiconductor device comprising an electrode thereon, wherein the electrode is electrically connected to the multilayer wiring structure;
   a plurality of stoppers surrounding the semiconductor device so as to face side surfaces of the semiconductor device; and
   a sealing resin sealing the semiconductor device and the stoppers,
   wherein a portion of each of the stoppers is embedded in an insulating layer of the multilayer wiring structure.

5. The semiconductor package of claim 4, wherein each of the stoppers is provided to face a corresponding corner of the semiconductor device.

6. The semiconductor package of claim 4, wherein the semiconductor device comprises four side surfaces, the number of stoppers is four, and each of the stoppers is provided to face a corresponding one of the side surfaces.

7. A semiconductor package, comprising:
   a multilayer wiring structure comprising a plurality of wiring layers and a plurality of insulating layers, the multilayer wiring structure comprising a first surface and a second surface opposite to the first surface;
   an external connection terminal on the first surface of the multilayer wiring structure;
   a semiconductor device on the second surface of the multilayer wiring structure, the semiconductor device comprising an electrode thereon, wherein the electrode is electrically connected to the multilayer wiring structure;
   a plurality of stoppers surrounding the semiconductor device so as to face side surfaces of the semiconductor device; and
   a sealing resin sealing the semiconductor device and the stoppers,
   wherein a minimum distance between a tip portion of each of the stoppers and the second surface of the multilayer wiring structure is smaller than a thickness of the semiconductor device.

8. The semiconductor package of claim 7, wherein each of the stoppers is provided to face a corresponding corner of the semiconductor device.

9. The semiconductor package of claim 7, wherein the semiconductor device comprises four side surfaces, the number of stoppers is four, and each of the stoppers is provided to face a corresponding one of the side surfaces.

* * * * *